(12) United States Patent
Kim et al.

(10) Patent No.: US 9,252,385 B2
(45) Date of Patent: Feb. 2, 2016

(54) ORGANIC LIGHT EMITTING DEVICE

(71) Applicant: LG Display Co., Ltd., Seoul (KR)

(72) Inventors: Tae-Kyung Kim, Jeollanam-do (KR);
Byoung Chul Kim, Jeollabuk-do (KR);
Myoung Soo Lee, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/546,158

(22) Filed: Nov. 18, 2014

(65) Prior Publication Data
US 2015/0155520 A1   Jun. 4, 2015

(30) Foreign Application Priority Data
Dec. 3, 2013   (KR) .................. 10-2013-0149400

(51) Int. Cl.
*H01L 51/52* (2006.01)

(52) U.S. Cl.
CPC ............ *H01L 51/52* (2013.01); *H01L 51/5253* (2013.01)

(58) Field of Classification Search
CPC ............ H01L 51/5237; H01L 51/5246; H01L 51/5253; H01L 27/3246
See application file for complete search history.

(56) References Cited

U.S. PATENT DOCUMENTS

| | | | | |
|---|---|---|---|---|
| 2002/0043686 A1* | 4/2002 | Bolam et al. | .................. | 257/349 |
| 2002/0106862 A1* | 8/2002 | Jordan et al. | .................. | 438/406 |
| 2002/0193035 A1* | 12/2002 | Wei et al. | ......... | 445/22 |
| 2003/0164674 A1* | 9/2003 | Imamura | .................. | 313/493 |
| 2005/0046347 A1* | 3/2005 | Kato et al. | ................. | 313/512 |
| 2006/0033429 A1* | 2/2006 | Fujimura et al. | ............. | 313/509 |
| 2006/0087229 A1* | 4/2006 | Kim | .................. | 313/509 |
| 2006/0091799 A1* | 5/2006 | Nakamura | ..................... | 313/512 |
| 2008/0237181 A1* | 10/2008 | Wagner et al. | .................. | 216/13 |
| 2011/0108809 A1* | 5/2011 | Seo et al. | ......... | 257/40 |
| 2014/0061624 A1* | 3/2014 | Nagata et al. | ................... | 257/40 |

FOREIGN PATENT DOCUMENTS

JP   5271924 B2 *   5/2013 ............. G03G 21/00

* cited by examiner

*Primary Examiner* — Tucker J Wright
(74) *Attorney, Agent, or Firm* — Morgan, Lewis & Bockius LLP

(57) ABSTRACT

An organic light emitting device includes a base substrate defining an active area and a pad area that surrounds the active area, an organic light emitting layer formed on the active area, a first protective layer formed to cover the active area, where the organic light emitting layer is formed, and the pad area, a second protective layer formed to cover the first protective layer, and a dam formed between the first protective layer and the second protective layer, wherein the dam is located at a boundary between the active area and the pad area and includes a groove that is positioned separate from an outer portion of the active area.

6 Claims, 6 Drawing Sheets

ORGANIC LIGHT EMITTING DEVICE

The present application claims the benefit of the Korean Patent Application No. 10-2013-0149400 filed in Korea on Dec. 3, 2013, which is hereby incorporated by reference in its entirety.

BACKGROUND

1. Technical Field

Embodiments of the present invention relate to an organic light emitting device that is able to secure a flatness of an organic layer and prevent a smear of an outer portion of an active area.

2. Discussion of the Related Art

Recently, liquid crystal display (LCD) devices have been widely used as flat panel display devices. The LCD devices use a backlight as a separate light source, and have technical limitations in brightness and contrast. To solve these problems, organic light emitting devices that self-emit light without a separate light source and have relatively better brightness and contrast than those of the LCD devices have been developed, and are being commercialized.

The organic light emitting devices are divided into a passive matrix type and an active matrix type depending on a driving mode. Hereinafter, an active matrix type organic light emitting device according to the related art will be described with reference to drawings. For reference, in the present specification, the active matrix type organic light emitting device is briefly referred to as an organic light emitting device.

FIG. 1 is a view schematically illustrating a structure of a related art organic light emitting device. As shown in FIG. 1, one pixel formed in an active area (an emission area) of an entire area of the organic light emitting device is illustrated, and a plurality of lines and a thin film transistor (TFT) for driving an organic light emitting diode (OLED) 40 are not illustrated.

Referring to FIG. 1, the related art organic light emitting device includes a base substrate 10, a TFT array layer 20, a planarization layer 30, an OLED 40, a first protective layer 50, a second protective layer 60, a third protective layer 70, and a plastic film 80.

Since the OLED 40 has characteristics that are vulnerable to moisture, the OLED 40 should be sealed from the outside. Therefore, a plurality of the protective layers 50, 60 and 70 are formed to cover the OLED 40, thereby protecting the OLED 40 from external moisture.

The first and third protective layers 50 and 70 are each formed as an inorganic protective layer, and the second protective layer 60 is formed as an organic protective layer. The plastic film 80 is formed on the first to third protective layers 50, 60 and 70, and an OLED panel is encapsulated by the plastic film 80.

FIG. 2 is a view schematically illustrating a structure of an organic emission layer.

Referring to FIG. 2, the OLED 40 is formed in a structure where a hole injecting layer (HIL) 42, a hole transport layer (HTL) 43, an organic emission layer (EML) 47, an electron transport layer (ETL) 46, and an electron injecting layer (EIL) 45 are sequentially stacked. An anode electrode 41 is formed under the HIL 42 to inject a positive hole, whereas a cathode electrode 44 is formed on the EIL 45 to inject an electron.

When an electron generated by the cathode electrode 44 and a positive hole generated by the anode electrode 41 are injected into the organic emission layer 47, the injected electron and positive hole are combined to generate an exciton. The generated exciton is dropped from an excited state to a ground state to emit light, and an image is displayed by using the emitted light.

FIG. 3 is a view for illustrating a problem in that an organic layer is thickly formed at an outer portion of an active area, in a structure of multi protective layers.

Referring to FIG. 3, among the multi protective layers 50, 60 and 70 for protecting the OLED 40 from an external factor, the first and third protective layers 50 and 70 that are inorganic protective layers are formed by using a first mask and a first chamber.

The second protective layer 60 that is an organic protective layer is formed by using a second chamber and a screen printing process using a second mask.

To describe the screen printing process, a mask is disposed on a substrate, and an organic material such as a polymer is dropped on the mask by using a nozzle equipment. The organic material is coated on the first protective layer 50 by using a squeeze bar, and then is fired in a chamber, thereby forming the second protective layer 60.

As described above, when the second protective layer 60 that is an organic layer is formed by the screen printing process, an organic layer formed at an edge of the active area is thickened (edge top).

When the second protective layer 60 that is an organic layer is thickly formed at the edge of the active area, a smear occurs, thereby degrading a display quality of an image.

SUMMARY

Accordingly, embodiments of the present invention are directed to provide an organic light emitting device that substantially obviates one or more problems due to limitations and disadvantages of the related art.

An aspect of embodiments of the present invention is directed to provide an organic light emitting device that is able to prevent a smear from occurring at an edge of an active area, in a structure of multi protective layers.

Another aspect of embodiments of the present invention is directed to provide an organic light emitting device that is able to secure a flatness of an organic layer for preventing the organic layer from being thickly formed at an edge of an active area, in a structure of multi protective layers In embodiments of the invention, an organic light emitting device includes a base substrate defining an active area and a pad area that surrounds the active area; an organic light emitting layer formed on the active area; a first protective layer formed to cover the active area, where the organic light emitting layer is formed, and the pad area; a second protective layer formed to cover the first protective layer; and a dam formed between the first protective layer and the second protective layer, wherein the dam is located at a boundary between the active area and the pad area and includes a groove that is positioned separate from an outer portion of the active area.

In embodiments of the invention, an organic light emitting device includes a base substrate defining an active area and a pad area that surrounds the active area; an organic light emitting layer formed on the active area; a first protective layer formed to cover the active area, where the organic light emitting layer is formed, and the pad area; a second protective layer formed to cover the first protective layer; and a bank that is thickly formed at a first edge side of the active area, at which a printing of the organic light emitting layer starts.

In addition to the aforesaid objects of embodiments of the present invention, other features and advantages of embodiments of the present invention will be described below, but will be clearly understood by those skilled in the art from descriptions below.

Additional advantages and features of embodiments of the invention will be set forth in part in the description which follows and in part will become apparent to those having ordinary skill in the art upon examination of the following or may be learned from practice of embodiments of the invention. The objectives and other advantages of embodiments of the invention may be realized and attained by the structure particularly pointed out in the written description and claims hereof as well as the appended drawings.

It is to be understood that both the foregoing general description and the following detailed description of embodiments of the present invention are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this application, illustrate embodiments of embodiments of the invention and together with the description serve to explain the principle of embodiments of the invention. In the drawings.

DETAILED DESCRIPTION

Figure 1:
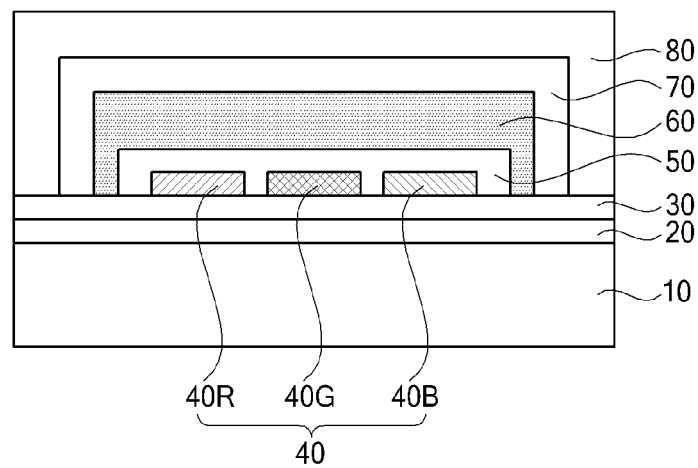
FIG. 1 is a view schematically illustrating a structure of a related art organic light emitting device.
Figure 2:
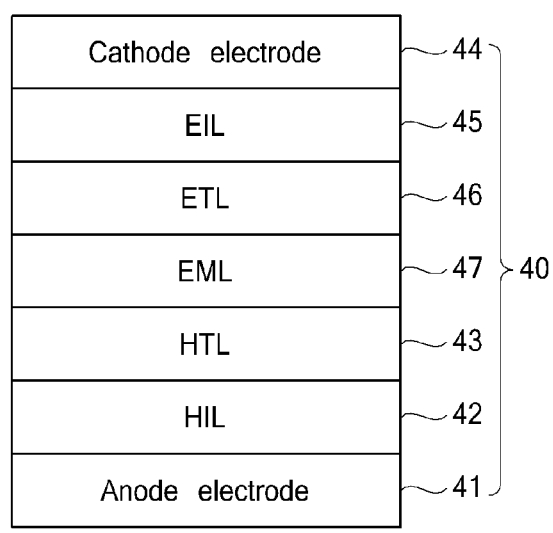
FIG. 2 is a view schematically illustrating a structure of an organic emission layer.
Figure 3:
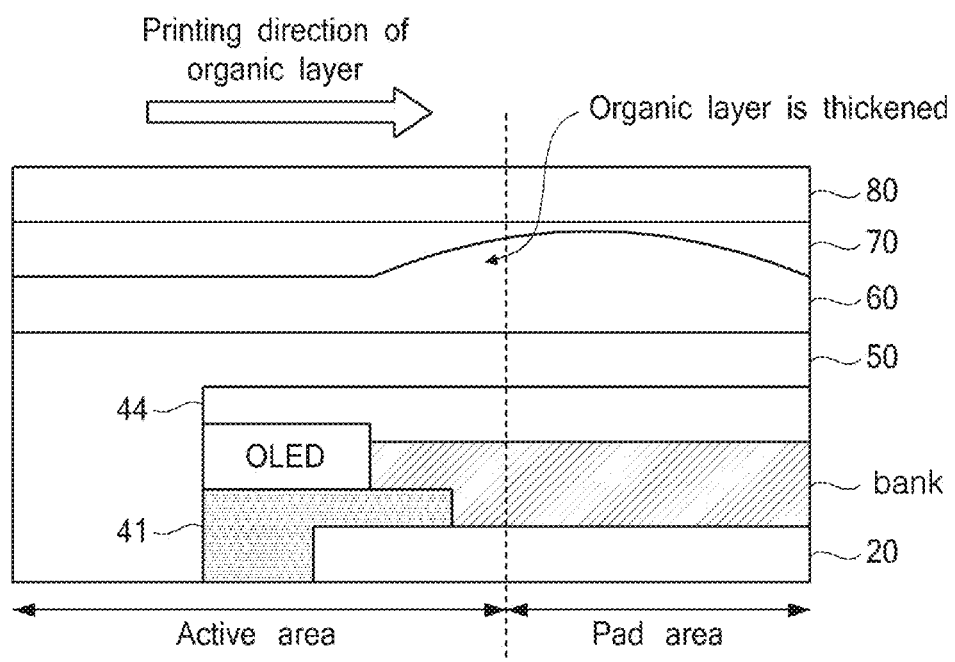
FIG. 3 is a view for illustrating a problem in that an organic layer is thickly formed at an outer portion of an active area, in a structure of multi protective layers.

Reference will now be made in detail to the exemplary embodiments of the present invention, examples of which are illustrated in the accompanying drawings. Wherever possible, the same reference numbers will be used throughout the drawings to refer to the same or like parts.

In the specification, in adding reference numerals for elements in each drawing, it should be noted that like reference numerals already used to denote like elements in other drawings are used for elements wherever possible.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms.

It should be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover a case where a third structure is disposed therebetween.

Hereinafter, exemplary embodiments of the present invention will be described in detail with reference to the accompanying drawings.

Figure 4:
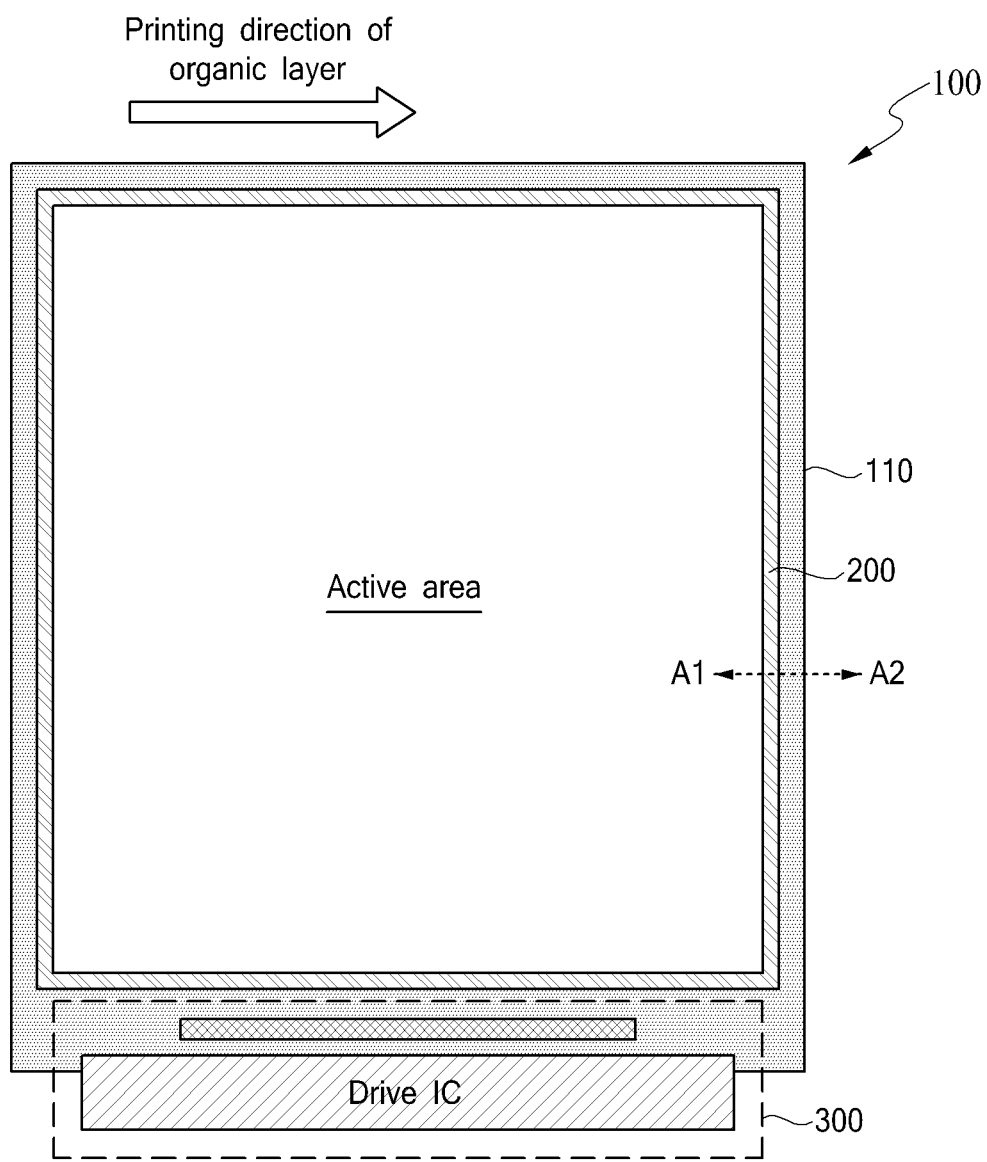
FIG. 4 is a view schematically illustrating an organic light emitting device according to a first exemplary embodiment of the present invention.

FIG. 4 is a view schematically illustrating an organic light emitting device according to a first exemplary embodiment of the present invention.

Referring to FIG. 4, the organic light emitting device according to the first exemplary embodiment includes a display panel 100 and a driving circuit unit 300.

A plurality of pixels are arranged in a matrix type in the display panel 100, and an OLED emitting light is formed in each of the plurality of pixels. The display panel 100 includes an active area (A1), in which the plurality of pixels are formed to emit light, and a pad area (A2) that is formed at an outer portion of the active area and surrounds the active area. A dam 200 is formed at a boundary between the active area and the pad area to surround the active area.

Figure 5:
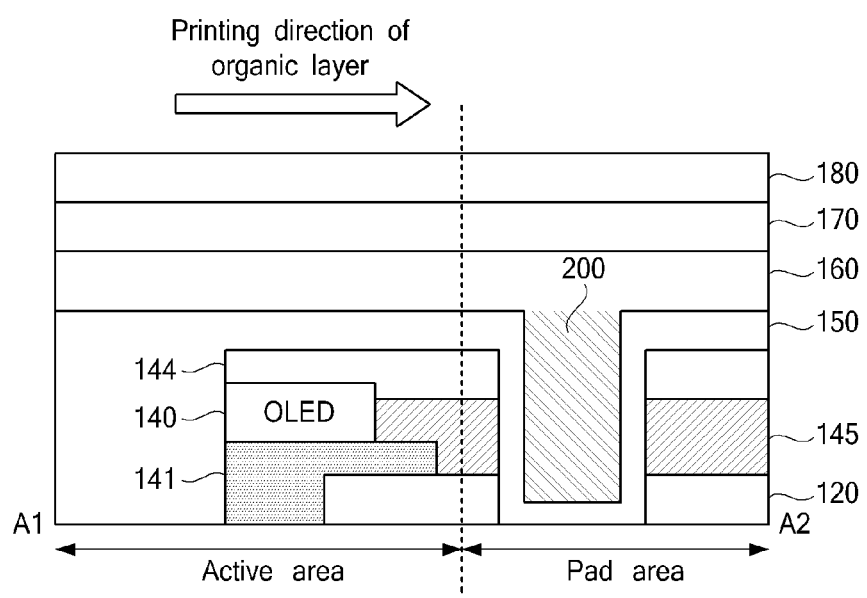
FIG. 5 is a cross-sectional view taken along line A1-A2 of FIG. 4, and is a view illustrating a structure of the organic light emitting device according to the first exemplary embodiment of the present invention.

FIG. 5 is a cross-sectional view taken along line A1-A2 of FIG. 4, and is a view illustrating a structure of the organic light emitting device according to the first exemplary embodiment.

Referring to FIG. 5, a planarization layer 120 is formed on a base substrate (110 in FIG. 4), and a bank 145 that defines an opening area of each pixel is formed on the planarization layer 120.

Here, the base substrate may use a transparent glass substrate. As another example, the base substrate may use a flexible substrate formed of a transparent material. A material of the flexible substrate may use any one or a combination of polyethyleneterephthalate (PET), polycarbonate (PC), polyethersulfone (PES), polyethylenapthanate (EN), polyimide (PI), or polynorborneen (PNB).

A TFT array (not shown) is formed on the base substrate, and an anode electrode 141 is formed on the base substrate so as to be connected to a driving TFT of each pixel. An OLED 140 is formed on the anode electrode 141, and a cathode electrode 144 is formed on the OLED 140.

The driving TFT and a plurality of switching TFTs for driving the OLED 140 are formed in the TFT array. Although not shown, a gate line, a data line, a driving power line, a reference voltage line, an emission signal line, and a capacitor (Cst) may be formed on a layer on which the TFT array is formed.

The OLED 140 has a structure in which a hole injecting layer (HIL), a hole transport layer (HTL), an organic emission layer (EML), an electron transport layer (ETL), and an electron injecting layer (EIL) are sequentially stacked. The OLED 140 is formed in each of the plurality of pixels in the active area, and emits light with a driving current that is applied through the driving TFT. In this case, the driving current applied to the OLED 140 is generated in correspondence with image data, for displaying an image.

Since the OLED 140 has characteristics that are very vulnerable to moisture, the OLED 140 should be sealed from the outside. Therefore, a structure of multi protective layers is formed to cover the OLED 140, for protecting the OLED 140 from external moisture.

As shown in FIG. 5, the multi protective layers, which are formed for protecting the OLED 140 from moisture and external factors, include a first protective layer 150 that is formed to cover the OLED 140, a second protective layer 160 that is formed to cover the first protective layer 150, and a third protective layer 170 that is formed to cover the second protective layer 160. A plastic film 180 is formed on the third protective layer 170, and an OLED panel is encapsulated by the plastic film 180.

The first and third protective layers 150 and 170 are each formed as an inorganic protective layer, and the second protective layer 160 is formed as an organic protective layer.

An encapsulation substrate (not shown) may be adhered to the plastic film 180, and may be formed of a metal material or a transparent material. For example, the encapsulation substrate may be formed of an INVAR (Fe-36Ni) alloy, a Fe-42Ni alloy, or a KOVAR (Fe—Ni—Co) alloy, in which nickel (Ni) is contained in iron (Fe).

The second protective layer 160 that is an organic layer is formed as a layer (a particle cover layer) that covers a foreign material occurring in a manufacturing process. The second protective layer 160 may be formed with a thickness of 5 μm. Since the second protective layer 160 has an excellent planarization function, the second protective layer 160 may fill a step height of a lower layer, and planarize the substrate.

When the second protective layer 160 formed of an organic layer is thickly formed at an edge of the active area, an edge top can occur. In the organic light emitting device according to the first embodiment of the present invention, the dam 200 is formed at a boundary between the active area and the pad area 110 so as to prevent the edge top from occurring. The dam 200 is formed to surround the active area. In the organic light emitting device according to the first exemplary embodiment, the second protective layer 160 is thereby not thickly formed at an edge of the active area, and prevents the edge top from occurring.

Here, the planarization layer 120 is formed to a thickness of 2 μm to 3 μm, and a bank 145 is formed to a thickness of 1 μm to 2 μm. The dam 200 is formed so that the planarization layer 120 and the bank 145 are not formed at the edge of the active area in a manufacturing process.

The dam 200 is formed with a groove at a portion that is separated from an outer portion of the active area by 100 μm or more. The dam 200 has a depth of 4 μm or more and a width of 50 μm or more.

Since the dam 200 is formed, the first protective layer 150 is formed along a profile of the dam 200, and the second protective layer 160 is formed to cover the first protective layer 150. Thus, the second protective layer 160 that is an organic layer is not thickly formed, and instead is planarly formed at the edge of the active area that is a portion in which the screen printing process for the organic layer is ended. Since the second protective layer 160 is planarly formed, the third protective layer 170 formed on the second protective layer 160 is planarly formed.

Here, the dam 200 is formed at an outer portion of the active area, and a thickly piled organic material flows to the dam 200 (which is formed at the outer portion of the active area) by using the squeeze bar. Therefore, the second protective layer 160 is not thickly formed but is planarly formed.

As described above, an edge top of the second protective layer 160 that is an organic layer does not occur, and thus, a screen smear can be prevented from occurring at the edge of the active area.

Figure 6:
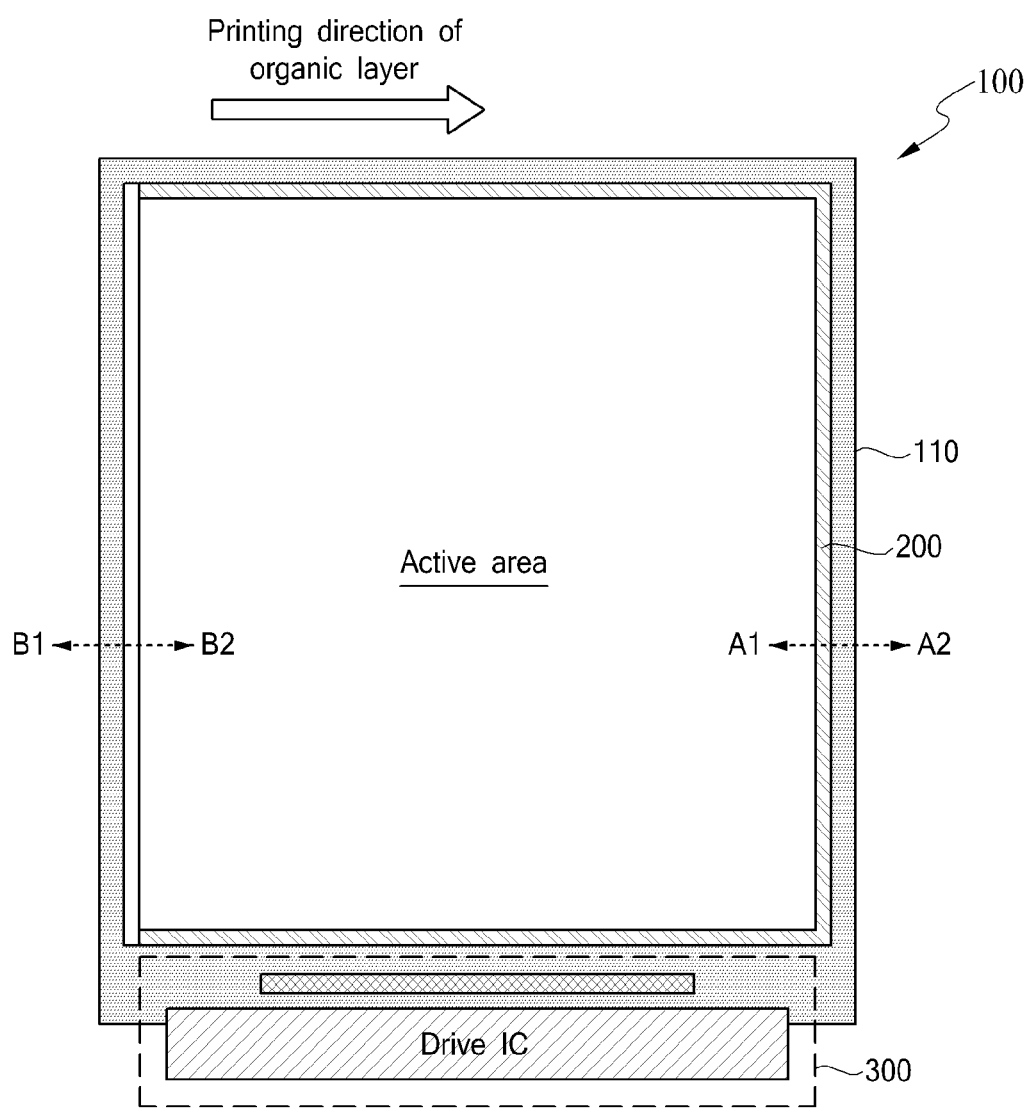
FIG. 6 is a view schematically illustrating an organic light emitting device according to a second exemplary embodiment of the present invention.

FIG. 6 is a view schematically illustrating an organic light emitting device according to a second exemplary embodiment. FIG. 7 shows cross-sectional views taken along lines A1-A2 and B1-B2 of FIG. 6, and illustrates a structure of the organic light emitting device according to the second exemplary embodiment. In describing the second exemplary embodiment, detailed descriptions on the same elements as those of the above-described organic light emitting device according to the first exemplary embodiment are not repeated.

A plurality of pixels (not shown) are arranged in a matrix type in the display panel 100, and an OLED 140 (of FIG. 7) emitting light is formed in each of the plurality of pixels. The display panel 100 includes an active area, in which the plurality of pixels are formed to emit light, and a pad area that is formed at an outer portion of the active area. A dam 200 is formed at a boundary between the active area and the pad area to surround the active area except at the boundary where the bank 145 is thickly formed.

A planarization layer 120 is formed on a base substrate, and a bank 145 that defines an opening area of each pixel is formed on the planarization layer 120.

A TFT array (not shown) is formed on the base substrate, and an anode electrode 141 is formed on the base substrate and is connected to a driving TFT of each pixel. An OLED 140 is formed on the anode electrode 141, and a cathode electrode 144 is formed on the OLED 140.

Since the OLED 140 has characteristics that are very vulnerable to moisture, the OLED 140 should be sealed from the outside. Therefore, a structure of multi protective layers is formed to cover the OLED 140, thereby protecting the OLED 140 from external moisture.

The multi protective layers, which are formed for protecting the OLED 140 from moisture and external factors, include a first protective layer 150 that is formed to cover the OLED 140, a second protective layer 160 that is formed to cover the first protective layer 150, and a third protective layer 170 that is formed to cover the second protective layer 160. A plastic film 180 is formed on the third protective layer 170, and an OLED panel is encapsulated by the plastic film 180.

The first and third protective layers 150 and 170 are each formed as an inorganic protective layer, and the second protective layer 160 is formed as an organic protective layer.

The second protective layer 160 that is an organic layer is formed as a layer (a particle cover layer) that covers a foreign material occurring in a manufacturing process. The second protective layer 160 may be formed to a thickness of 5 μm. Since the second protective layer 160 has an excellent planarization function, the second protective layer 160 may fill a step height of a lower layer, and planarize the substrate.

When the second protective layer 160 formed of an organic layer is thickly formed at an edge of the active area, an edge top can occur. In the organic light emitting device according to the second embodiment of the present invention, the dam 200 is formed at a boundary between the active area and the pad area so as to prevent the edge top from occurring.

Here, the planarization layer 120 is formed to a thickness of 2 μm to 3 μm, and a bank 145 is formed to a thickness of 1 μm to 2 μm. The dam 200 is formed so that the planarization layer 120 and the bank 145 are not formed at the edge of the active area in a manufacturing process.

Figure 7A:
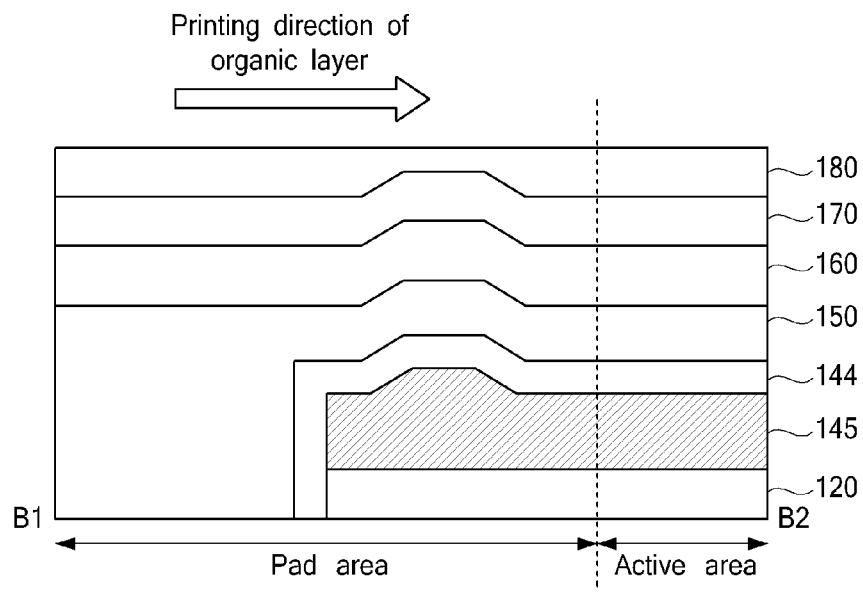
FIGS. 7A and 7B are cross-sectional views taken along lines A1-A2 and B1-B2 of FIG. 6, and are views illustrating a structure of the organic light emitting device according to the second exemplary embodiment of the present invention.

As shown in FIG. 7A, a bank 145 is thickly formed at a first side (a left side of FIG. 6) of the edge of the active area. In this case, the bank 145 is thickly formed to a thickness of 4 μm to 6 μm, at a portion in which printing of the organic layer is started. When a bank is formed on the bank 145 in the pad area, the bank can prevent penetration of moisture from the outside.

Figure 7B:
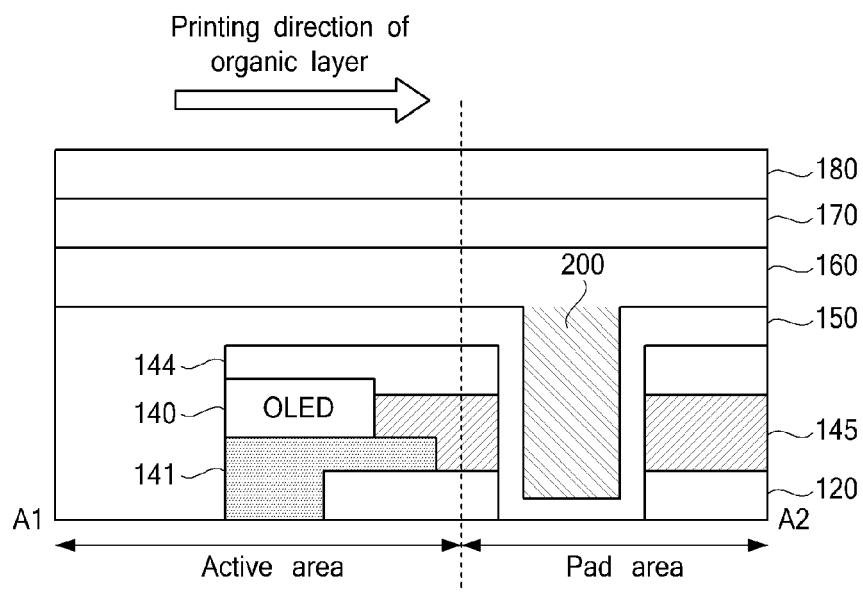

As shown in FIG. 7B, the dam 200 is formed at a second side (a right side of FIG. 6) of the edge of the active area. The bank 145 is thickly formed at a portion in which the printing of the organic layer is started, in a manufacturing process. In addition, the dam 200 is formed at a portion in which the printing of the organic layer is ended, in the manufacturing process.

The dam 200 is formed with a groove at a position that is separated from an outer portion of the active area by 100 μm or more. The dam 200 has a depth of 4 μm or more and a width of 50 μm or more.

Since the dam 200 is formed, the first protective layer 150 is formed along a profile of the dam 200, and the second protective layer 160 is formed to cover the first protective layer 150. Thus, the second protective layer 160 that is an organic layer is not thickly formed but is planarly formed at the edge of the active area that is a portion in which the screen printing process for the organic layer is ended. Since the second protective layer 160 is planarly formed, the third protective layer 170 formed on the second protective layer 160 is planarly formed.

Here, the dam 200 is formed at the pad area (an outer portion of the active area), and a thickly piled organic material flows to the dam 200 (which is formed at the outer portion of the active area) by using the squeeze bar. Therefore, the second protective layer 160 is not thickly formed but is planarly formed.

As described above, an edge top of the second protective layer 160 that is an organic layer does not occur, and thus, a screen smear can be prevented from occurring at the edge of the active area.

As another example, red (R), green (G), and blue (B) color filter pigments of organic photoresist (PR) are stacked on the bank 145, thereby forming another bank on the bank 145. When the bank is formed on the bank 145 in the pad area, the bank can prevent penetration of moisture from the outside.

Moreover, embodiments of the present invention can prevent organic materials from being spread to an outer portion of panel in forming an organic protective layer, and prevent an edge from being thickened.

In the organic light emitting device according to the embodiments of the present invention, the organic layer is prevented from being thickly formed at the edge of the active area, in the structure of multi protective layers, thereby securing a flatness of the organic layer.

In the organic light emitting device according to the exemplary embodiments, a smear can be prevented from occurring at the edge of the active area, in the structure of multi protective layers.

It will be apparent to those skilled in the art that various modifications and variations can be made in embodiments of the present invention without departing from the spirit or scope of the inventions. Thus, it is intended that embodiments of the present invention covers the modifications and variations of this invention provided they come within the scope of the appended claims and their equivalents.

What is claimed is:

1. An organic light emitting device, comprising:
    a base substrate defining an active area and a pad area that surrounds the active area;
    an organic light emitting layer formed on the active area;
    a first protective layer formed to cover the active area, where the organic light emitting layer is formed, and the pad area;
    a second protective layer formed to cover the first protective layer, wherein the second protective layer is an organic layer;
    a dam formed between the first protective layer and the second protective layer,
    wherein the dam is located at a boundary between the active area and the pad area and includes a groove that is positioned separate from an outer portion of the active area, and
    wherein the groove of the dam receives organic material;
    a planarization layer on the base substrate; and
    a bank on the planarization layer,
    wherein the planarization layer and the bank are not formed at the dam.

2. The organic light emitting device according to claim 1, wherein the dam surrounds the active area.

3. The organic light emitting device according to claim 1, wherein the second protective layer is an organic layer and covers a foreign material occurring in a manufacturing process.

4. The organic light emitting device according to claim 3, wherein the second protective layer is planarly formed at the boundary.

5. The organic light emitting device according to claim 1, wherein the dam is separated from the outer portion of the active area by at least 100 μm.

6. The organic light emitting device according to claim 5, wherein the dam has a depth of at least 4 μm and a width of at least 50 μm.

* * * * *